US006312979B1

(12) United States Patent
Jang et al.

(10) Patent No.: US 6,312,979 B1
(45) Date of Patent: Nov. 6, 2001

(54) METHOD OF CRYSTALLIZING AN AMORPHOUS SILICON LAYER

(75) Inventors: Jin Jang, 102-1103, Hyundae Apt. 53, Jamwon-dong, Seocho-ku, Seoul; Soo Young Yoon, Daejeon; Hyun Churl Kim, Jeju, all of (KR)

(73) Assignees: LG.Philips LCD Co., Ltd.; Jin Jang, both of Seoul (KR)

( * ) Notice: Subject to any disclaimer, the term of this patent is extended or adjusted under 35 U.S.C. 154(b) by 0 days.

(21) Appl. No.: 09/299,571

(22) Filed: Apr. 27, 1999

Related U.S. Application Data

(63) Continuation-in-part of application No. 09/115,498, filed on Jul. 14, 1998.

(30) Foreign Application Priority Data

Apr. 28, 1998 (KR) .................................................. 98-15085

(51) Int. Cl.$^7$ .................................................. H01L 21/00
(52) U.S. Cl. .................... 438/166; 438/149; 438/151; 438/155; 438/162; 438/166
(58) Field of Search .................... 438/166, 155, 438/149, 151, 162

(56) References Cited

U.S. PATENT DOCUMENTS

| 4,309,225 | 1/1982 | Fan et al. ........................... 148/1.5 |
| 4,626,448 | 12/1986 | Hays ..................................... 427/39 |
| 5,147,826 | 9/1992 | Liu et al. ........................... 438/486 |
| 5,275,851 | 1/1994 | Fonash et al. ...................... 438/479 |

(List continued on next page.)

FOREIGN PATENT DOCUMENTS 2-140915   5/1990   (JP) .

8-006053   1/1996   (JP) .
8-6053     1/1996   (JP) .

OTHER PUBLICATIONS

Jai II Ryu, Hyun Churl Kim and Jin Jang, "A Novel Self–Aligned Polycrystalline Silicon Thin–Film Transistor Using Silicide Layers," IEEE Electron Device Letters, vol. 11, No. 6, Jun. 1997, pp. 123–125.

K.S. Song, S.H. Park, S.I. Jun and D.K. Choi, "A Crystallization of the Amorphous Silicon Using Field Aided Lateral Crystallization" Department of Inorganic Materials Engineering, Hanyang University, 1997, pp. 144–150.

Materials Research Society, Abstracts, Apr. 13–17, 1998, p. 55.

(List continued on next page.)

Primary Examiner—Vu A. Le
Assistant Examiner—Pho Luu
(74) Attorney, Agent, or Firm—Long Aldridge & Norman LLP

(57) ABSTRACT

The present invention relates to a method of crystallizing an amorphous silicon layer which is carried out by depositing a crystallization-inducing substance on an amorphous silicon layer on crystallizing the amorphous silicon layer by metal-induced crystallization whereby speed of crystallizing silicon is increased and metal contamination by MIC is reduced. The present invention includes the steps of depositing a crystallizing-induced layer of an induced substance for crystallizing silicon on an amorphous silicon layer wherein the crystallizing induced layer is formed to the thickness under 0.03 angstroms, and treating thermally the amorphous silicon layer on which the crystallizing-induced layer is deposited. In another aspect, the present invention includes the steps of forming a crystallizing-induced substance on an amorphous silicon layer wherein the crystallizing-induced substance has predetermined density on an unit area of the amorphous silicon layer, and treating thermally the amorphous silicon layer on which the crystallizing-induced substance is formed.

21 Claims, 23 Drawing Sheets

U.S. PATENT DOCUMENTS

| | | | |
|---|---|---|---|
| 5,364,664 | 11/1994 | Tsubouchi et al. | 427/535 |
| 5,403,763 | 4/1995 | Yamazaki | 438/268 |
| 5,403,772 | 4/1995 | Zhang et al. | 438/166 |
| 5,426,064 | 6/1995 | Zhang et al. | 438/166 |
| 5,481,121 | 1/1996 | Zhang et al. | 257/64 |
| 5,488,000 | 1/1996 | Zhang et al. | 438/166 |
| 5,492,843 | 2/1996 | Adachi et al. | 437/21 |
| 5,501,989 | 3/1996 | Takayama et al. | 438/155 |
| 5,508,533 | 4/1996 | Takemura | 257/64 |
| 5,529,937 | 6/1996 | Zhang et al. | 438/471 |
| 5,534,716 | 7/1996 | Takemura | 257/72 |
| 5,543,352 | 8/1996 | Ohtani et al. | 438/487 |
| 5,550,070 | 8/1996 | Funai et al. | 438/486 |
| 5,569,610 | 10/1996 | Zhang et al. | 438/166 |
| 5,576,222 | 11/1996 | Arai et al. | 437/4 |
| 5,619,044 | 4/1997 | Makita et al. | 257/64 |
| 5,639,698 | 6/1997 | Yamazaki et al. | 437/228 |
| 5,663,077 | 9/1997 | Adachi et al. | 438/151 |
| 5,677,240 | 10/1997 | Murakami et al. | 437/195 |
| 5,985,741 | 11/1999 | Yamazaki et al. | 437/486 |
| 6,066,547 * | 5/2000 | Mackawa | 438/486 |
| 6,093,587 * | 7/2000 | Ohtani | 438/166 |
| 6,097,037 * | 8/2000 | Joo et al. | 257/55 |
| 9,115,498 | 4/1998 | Jang et al. . | |
| 9,170,625 | 10/1998 | Choi . | |
| 9,350,816 | 4/1999 | Jang et al. . | |

OTHER PUBLICATIONS

Kyung–Sub Song and Duck–Kyun Choi, "Electric Field Effect on the Metal Induced Crystallization of Amorphous Silicon," Proceedings of the Eighth International Symposium on Silicon–on Insulator Technology and Devices, vol. 97-23, pp. 75–80.

Kyung–Sub Song, Seung–Ik Jun, Sang–Hyun Park and Duck–Kyun Choi, "I–V Characteristics of Poly–Silicon Thin Film Transistors By Field Aided Lateral Crystallization (FALC)," 5th International Conference on VLSI and CAD, Oct. 13–15, 1997, pp. 187–189.

Seung–Ik Jun, Kyung–Sub Song, Sang–Hyun Park and Duck–Kyun Choi, "Fabrication of Low Temperature Poly–Silicon Thin Film Transistor Using Field Aided Lateral Crystallization (FALC)," The First Asian–European International Conference on Plasma Surface Engineering, Oct. 5–9, 1997.

Kyung–Sub Song, Seung–Ik Jun, Sang–Hyun Park and Duck–Kyun Choi, "Enhanced Crystallization of Amorphous Silicon Using Electric Field," Proc. the 12th KACG Tech. Meting and the 4th Korea–Japan EMGS.

Y. Masaki, P. G. LeComber, and A. G. Fitzgerald, "Solid Phase Crystallization of Thin Films of Si Prepared by Plasma–Enhanced Chemical Vapor Deposition," *J. Appl. Phys.* 74 (1), Jul. 1, 1993, pp. 129–134.

Dong Kyun Sohn, Jeong No Lee, Sang Won Kang and Byung Tae Ahn, "Low–Temperature Crystallization of Amorphous Si Films By Metal Adsorption and Diffusion," *J. Appl. Phys.*, vol. 35 (1996) Pt. 1, No. 2B, pp. 1005–1009.

Y. Kawazu, et al., Low–Temperature Crystallization of Hydrogenated Amorphous Silicon Induced by Nickel Silicide Formation, Japanese Journal of Applied Physics, vol. 29, No. 12, Dec. 1990, pp. 2698–2704.

U.S. application No. 09/115,498, Jang et al., filed Apr. 14, 1998.

U.S. application No. 09/170,625, Choi, filed Oct. 13, 1998.

U.S. application No. 09/350,816, Jang et al., filed Apr. 9, 1999.

* cited by examiner a) Ni 4 Å     b) Ni 7 Å c) Ni 13 Å     d) Ni 25 Å

200 nm

= 1μm 200 nm

CRYSTALLIZATION NUCLEUS

US 6,312,979 B1

METHOD OF CRYSTALLIZING AN AMORPHOUS SILICON LAYER

This is a continuation-in-part application of application Ser. No. 09/115,498, filed Jul. 14, 1998.

This application claims the benefit of Korean Patent Application No. 1998-15806, filed on Apr. 28, 1998, which is hereby incorporated by reference.

BACKGROUND OF THE INVENTION

1. Field of Invention

The present invention relates to a method of crystallizing an amorphous silicon layer by depositing a crystallization-inducing substance on an amorphous silicon layer and crystallizing the amorphous silicon layer with metal-induced crystallization (MIC).

2. Discussion of Related Art

Field effect mobility and stability against ray-irradiation of polycrystalline silicon thin film transistors (poly-Si TFTs) are greater and better than those of an amorphous silicon thin film transistor (a-Si TFT). The poly-Si TFT is applied to a driving device and a basic device of a peripheral circuit of an active matrix liquid crystal display (AMLCD).

Able to be fabricated on a glass substrate, a low temperature poly-Si TFT (TFT fabricated under a low temperature condition) used in the AMLCD lowers production costs and provides a wide vision. Moreover, the low temperature poly-Si TFT shows operating speeds of a peripheral circuit as good as that of a high temperature poly-Si TFT (TFT fabricated under a high temperature).

There are various methods of fabricating poly-Si, which methods are mainly divided into two. One method is to directly depositing poly-Si; the other method is to crystallize an already deposited amorphous silicon. There are many methods of depositing directly poly-Si, such as thermal chemical vapor deposition (CVD), hydrogen radical(HR) CVD, catalytic CVD, electron cyclotron resonance (ECR) CVD, plasma enhanced (PE) CVD, low pressure (LP) CVD, or the like.

Solid phase crystallization (SPC) and liquid phase crystallization (LPC) are used for crystallizing an already deposited amorphous silicon. Specifically, SPC by rapid thermal annealing (RTP) or furnace annealing has benefits in forming poly-Si having crystalline phases of relatively large size and which provides a simplified-fabrication process. Yet it also has defects of annealing over 600° C., requiring a thermal treatment which takes a long time.

A crystallization method by a pulse laser such as an excimer laser, etc., has the benefits of low temperature of a substrate under 400° C. for the growth and excellent field effect mobility. However, the method shows poor uniformity on a layer and requires expensive equipment.

Lately, there are many studies to lower the crystallization temperature to form a poly-Si. One of them is metal induced crystallization (MIC). The temperature for crystallizing amorphous silicon drops down under 500° C. provided that specific metals are contacted with amorphous silicon, which is the so-called MIC effect. The MIC effect appears in many metal atoms. The MIC effect is driven by two kinds of metals, which are the noble metals, such as Au[13], Ag, Al[11], Sb[14], In[15], etc., and the transition metals forming silicide with silicon, such as Ti[16], Ni[17,18], Cu, and the like.

MIC has various factors of crystallization according to each metal, namely, the crystallization depends on a species of metal contacted with silicon. The noble metals, such as Al, Au, Ag, etc., are affected by Si diffusion at an interface with Si. Silicide of a pseudo-stable state are formed by Si diffusion at the interface between Si and metal. Such silicide accelerates Si crystallization by lowering crystallization energy. Si atoms penetrate into a metal-silicide layer to be diffused, whereby Si crystals are formed at a border of silicide. In this case, flower-typed crystals are extracted to the surface. While transition metals, such as Ni, Ti, etc., depend mainly on metal diffusion caused by annealing, metal diffusion is driven to an Si layer from an interface between metal and Si to form silicide which accelerates crystallization of Si and decreases the crystallization temperature.

MIC by Ni or $NiSi_2$ (which is the last phase of Ni silicide) accelerates crystallization by working as a crystallizing nucleus. In fact, a lattice constant of $NiSi_2$ is 5.406 Å, which is similar to that of Si of 5.430 Å. Thereby $NiSi_2$ which works as a crystallizing nucleus of amorphous silicon between Ni and amorphous silicon, accelerates crystallization.

Ni silicide experiences phase changes through $Ni_2Si$ [NiSi, $NiSi_2$] in accordance with the increase of annealing temperature. When the annealing temperature is under 200° C., $NiSi_2$ of an orthorhombic structure is formed. As the annealing temperature increases, NiSi, which shows the lowest resistance among Ni silicide and whose directions are [211] and [102], is formed between 250° C. and 390° C. Between 325° C. and 450° C., fluoride-type $NiSi_2$ is formed. Then amorphous silicon turns into poly-Si, as $NiSi_2$ working as a nucleus for crystal growth passes through the amorphous silicon layer.

Ni-induced crystallization experiences three major steps: forming $NiSi_2$ silicide, working as a crystallizing nucleus for amorphous silicon, and changing amorphous silicon into poly-Si on $NiSi_2$'s passing through an amorphous silicon layer.

For an example of MIC, there is a method comprising the forming of an Ni layer to the thickness of over 25 Å on an amorphous silicon layer and then annealing the amorphous silicon layer thermally.

Referring to FIG. 11d, the degree of roughness at the surface of a silicon layer formed by the above method of crystallizing an amorphous silicon layer is unfortunately too high. This is because the Ni layer is too thick. As the sizes of the grains become smaller, due to the close distances among crystallizing nuclei, the surface becomes rougher due to the crystallization activated by the crystallizing nuclei, which number is increased.

In order to generate the crystallizing nuclei, at least several hundred Ni atoms are essential. Accordingly, as the Ni layer becomes thick, the distances among the nuclei become closer and causes roughness on the surface due to the crystallization by the nuclei. Such roughness on the surface of the layer makes the characteristics of a TFT poor.

Moreover, the MIC includes a method comprising the coating of a surface of an amorphous silicon layer with a metal solution, such as an Ni solution, and annealing thermally the amorphous silicon layer.

Referring to FIG. 17B, when the amorphous silicon layer is crystallized by the above method, a perfect crystallization is completed, after long time at 500° C. But the surface is contaminated by a solution and it is very difficult to leave an uniform Ni thickness over large area.

SUMMARY OF THE INVENTION

Accordingly, the present invention is directed to a method of crystallizing an amorphous layer that substantially obviates one or more of the problems due to limitations and disadvantages of the related art.

The object of the present invention is to provide a method of crystallizing an amorphous layer which crystallizes an amorphous silicon layer by metal induced crystallization by depositing an induced substance layer to the minimum thickness on the amorphous silicon layer for inducing the Si crystallization, whereby the degree of Si crystallization is maximized without metal contamination.

Another object of the present invention is to provide a method of crystallizing an amorphous layer which crystallizes an amorphous silicon layer by metal induced crystallization by depositing an induced substance layer having a predetermined metal density on the amorphous silicon layer for inducing the Si crystallization, whereby the degree of Si crystallization is maximized without metal contamination.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of depositing a crystallizing-induced layer of an induced substance for crystallizing silicon on an amorphous silicon layer wherein the crystallizing induced layer is formed to the thickness under 1.0 nm, and treating thermally the amorphous silicon layer on which the crystallizing-induced layer is deposited.

In another aspect, the present invention includes the steps of forming a crystallizing-induced substance on an amorphous silicon layer wherein the crystallizing-induced substance has predetermined density on a unit area of the amorphous silicon layer, and treating thermally the amorphous silicon layer on which the crystallizing-induced substance is formed.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Figure 1:
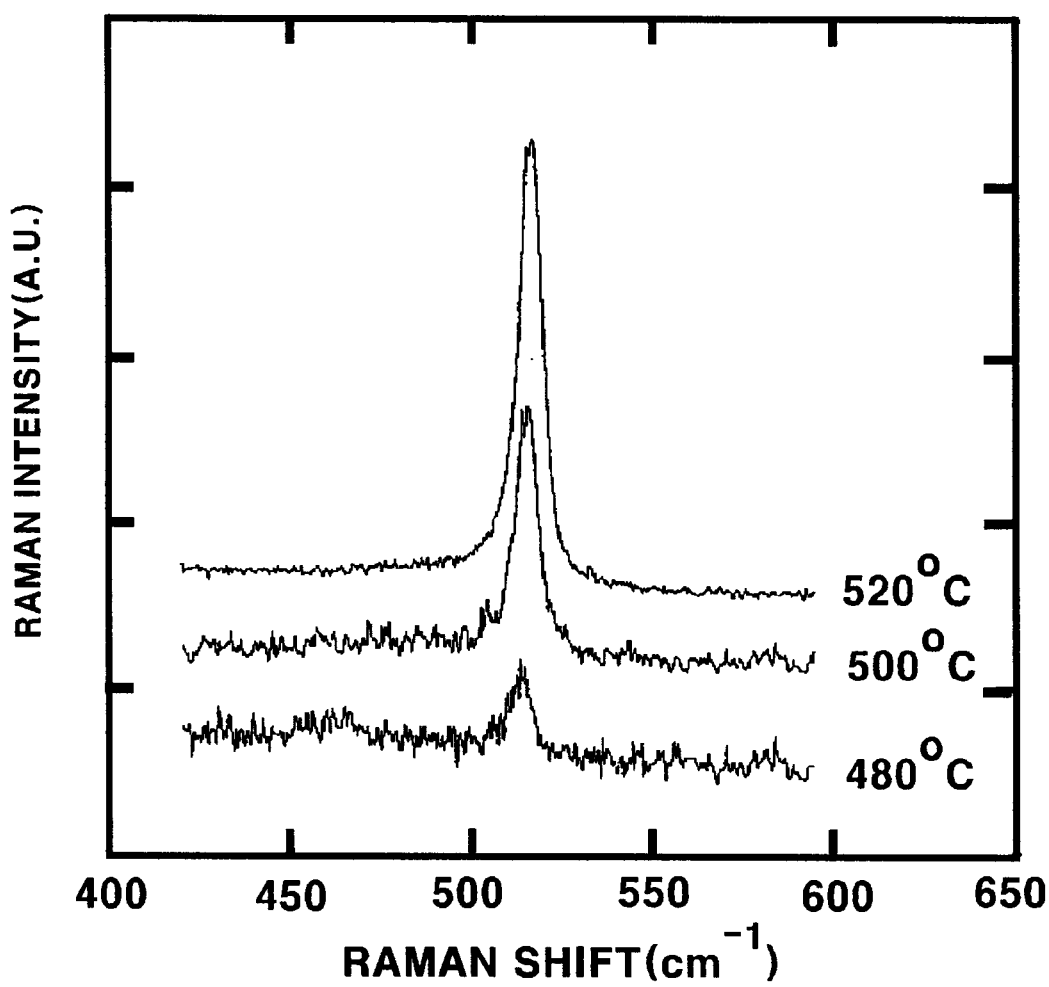
FIG. 1 shows Raman spectrum of a poly-Si layer crystallized in accordance with annealing temperature.

Reference will now be made in detail to the preferred embodiment of the present invention, an example of which is illustrated in the accompanying drawings.

In the following description of MIC, the present invention is explained by the results and experiments for showing the degree of crystallizing amorphous silicon according to Ni thickness or Ni density wherein an Ni layer is deposited on an amorphous silicon layer.

Experiment

I. Procedure

Amorphous silicon is deposited by inductively coupled plasma chemical vapor deposition (ICPCVD) in which plasma is generated by using a panel-type antenna. The panel-type antenna is wound four times rectangularly with a panel-type Cu coil, which width is 20 mm.

In ICPCVD equipment, a quartz window, which thickness and diameter are 30 and 260 mm, respectively, is placed over a reactive chamber. A distribution ring of a round type lies 30 mm distant from a bottom of the quartz window wherein gases such as He, $H_2$, $SiH_4$ and the like flow into the distribution ring. The panel-type antenna is connected to a power supply having a radio frequency (rf) of 13.56 MHz and generates plasma which decreases the damage of a layer and has high ion density by ICPVD.

A sample is prepared by using a glass, preferably Corning 7059, and a wafer of monocrystalline silicon as substrates. The substrate is cleaned to remove organic particles adsorbed to a surface itself by being put in a trichloethylene (TCE) solution, by being boiled for about 10 minutes on a hot plate and by being cleaned with supersonic waves. Having been treated by supersonic waves in acetone and methanol, the substrate is cleaned with DI water sufficiently. Then the substrate is completely dried with $N_2$ gas. Amorphous silicon is deposited for Ni induced crystallization by ICPCVD in use of mixed gases of $He/H_2SiH_4$. Details for deposition are shown in Table 1.

TABLE 1

Condition for depositing an amorphous silicon layer by ICPCVD.

| | |
|---|---|
| Substrate Temperature (C.) | 280 |
| pressure(mTorr) | 230 |
| RF power(W) | 40 |
| Gas Flow Rate(sccm) | |
| He | 100 |
| $H_2$ | 1.0 |
| $SiH_4$ | 1.0 |

An amorphous silicon layer of 2000 Å is used for recrystallization. An optical band gap of amorphous silicon is 1.8 eV. Dark electroconductivity and photo conductivity are about $4.5 \times 10^{-10}$ S/cm and $3.0 \times 10^{-6}$ S/cm, respectively. Activation energy of conductivity appears to be about 0.78 eV. A Ni layer is deposited by RF sputtering on an amorphous silicon layer prepared for crystallization. Then crystallization is achieved by annealing under nitrogen ambience.

In the experiment, a polycrystalline layer is attained by varying crystallization temperature and thickness of Ni deposited on the amorphous silicon layer. In this case, the annealing time is fixed to about 5 hours. When amorphous silicon is crystallized by using a Ni layer, thickness of the Ni layer average is set between about 0.01 and 25 Å.

When a small quantity of Ni, which is unable to form a film is deposited to be distributed on the amorphous silicon layer with predetermined density, distribution density of Ni varies between about $2 \times 10^{11}/cm^2$ and $7 \times 10^{13}/cm^2$ on the amorphous silicon layer to crystallize the amorphous silicon layer. In this case, it is desirable to control RF power under 10 W for sputtering.

Characteristics are analyzed by varying the annealing temperature between about 480° C. and 560° C. on crystallizing amorphous silicon by MIC.

II. Data Analysis

Raman spectrum is measured to attain a degree of crystallization of a prepared poly-Si layer. Measured Raman intensity is classified into crystalline and amorphous silicon (or microcrystalline silicon of which grains are microscopic). Near 480 cm$^{-1}$, an appearing shoulder shows a transverse optical (hereinafter abbreviated TO) phonon mode of amorphous part, while a sharp peak near 520 cm$^{-1}$ shows the other TO phonon mode of crystalline silicon.

The degree of crystallization is represented by the following formulas, wherein peak intensity of the crystalline and amorphous parts are designated by $I_c$ and $I_a$, respectively.

$$I_c = \sum_c \sigma[1 - \exp(-\alpha_c d)], I_a = \sum_a (1-\sigma)[1 - \exp(-\alpha_a d)] \quad (1)$$

$$\sum_c \sigma(\equiv I'_c) \text{ and } \sum_a (1-\sigma)(\equiv I'_a)$$

are approximated provided that thickness d is sufficiently thick. Thus, the degree of crystallization can also be approximated as follows:

$$\sigma = I'_c/(I'_c + \gamma I'_a) \quad (2)$$

wherein σ, α, Σ, represent degree of crystallization, absorption coefficient and backscattering cross section, respectively. In this formula, a and c indicate amorphous and crystalline, respectively, and $\alpha_c = 2 \times 10^4$ cm-1, $\alpha_a = 1 \times 10^5$ cm-1. And, γ shows a ratio of a back scattering cross section and is fixed to 0.8.

III. Results (1) Characteristics of a Poly-Si layer According to an Annealing Temperature Change.

In the following results showing the characteristics of a poly-Si layer, Ni layer for crystallizing amorphous silicon is formed to the thickness of about 0.4 nm in order to reduce Ni contamination. Sputtering or vacuum deposition technique may be applied to the deposition of a Ni layer on the amorphous silicon layer. However, other deposition technique known to one of ordinary skill in the art may also be applied.

FIG. 1 shows Raman spectrum of a poly-Si layer crystallized in accordance with annealing temperature. Referring, to FIG. 1, crystallization of amorphous silicon has occurred at 480° C. as all crystalline peaks near 520 cm$^{-1}$ show up in the Raman peak according to annealing temperature. Peak intensity increases as the annealing temperature rises. The degree of crystallization of a poly-Si layer by Ni induced crystallization is improved as annealing temperature rises. This result corresponds to the result of ordinary solid phase crystallization.

The amorphous peak scarcely appears regardless of annealing temperature, so that the degree of crystallization becomes over 90%. Full width at half maximum (FWH) of crystalline peaks are around 7~8 cm$^{-1}$, which is the same in all the samples.

Figure 2:
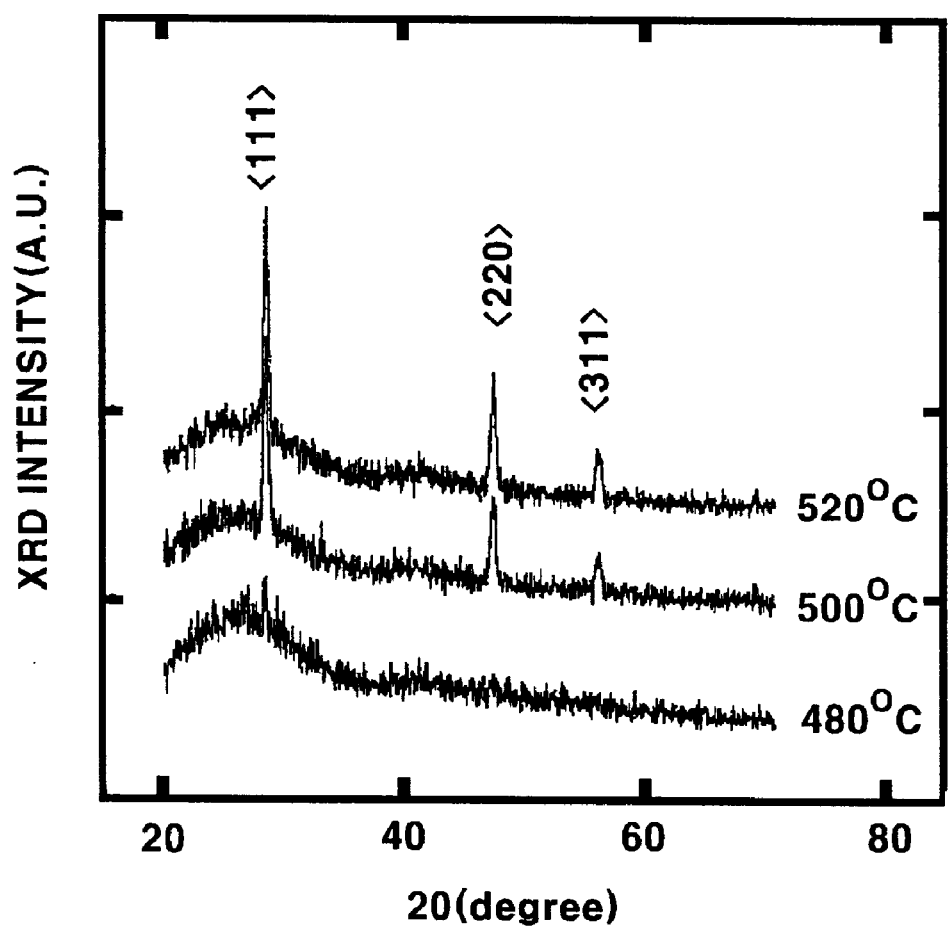
FIG. 2 shows XRD peaks of a poly-Si layer crystallized in accordance with annealing temperature.

FIG. 2 shows XRD peaks of a poly-Si layer crystallized in accordance with annealing temperature. Referring to FIG. 2, only peaks to the direction of <111> in a poly-Si crystallized at annealing temperature of about 480° C. are measured, while peaks of the directions of <220> and <311> show up from about 500° C. As the annealing temperature increases, so does each intensity of the peaks. Accordingly, as the annealing temperature rises, the crystallization of the layer is improved and XRD peak intensity of each of the directions <111>, <220> and <311> increases.

Figure 3:
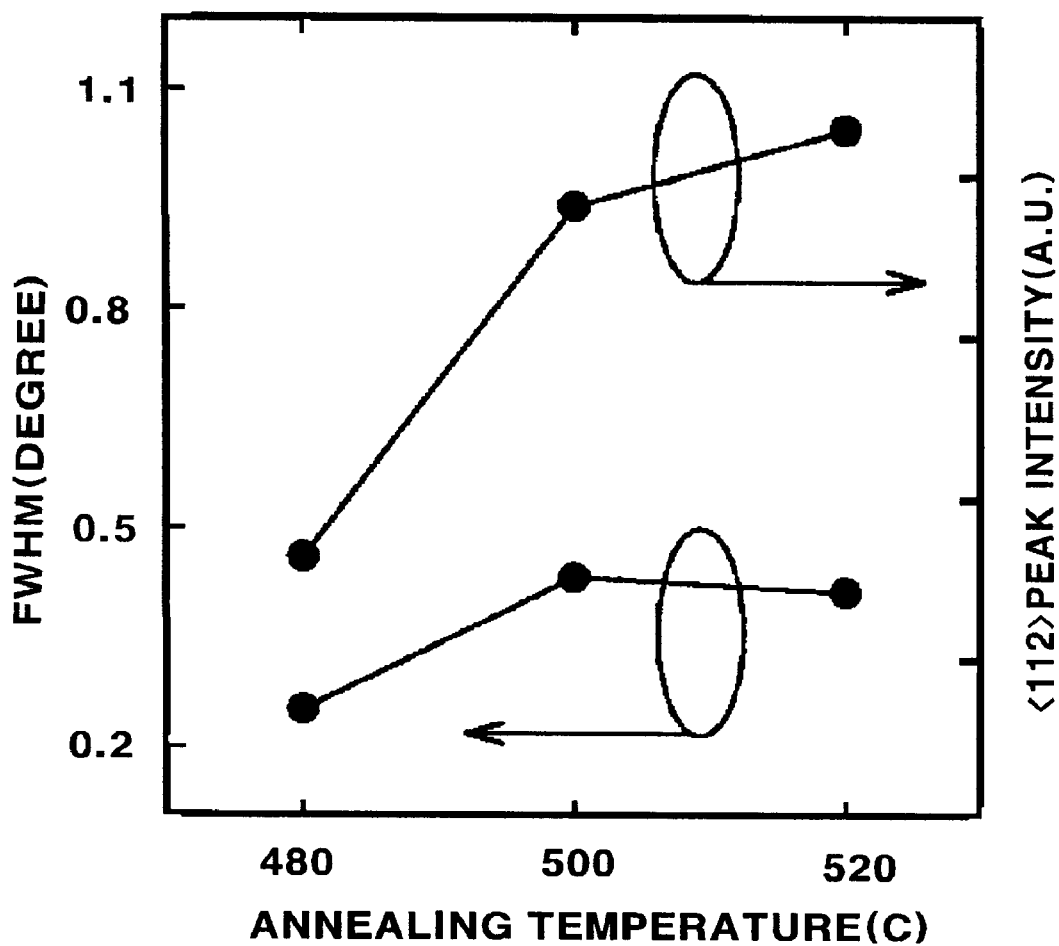
FIG. 3 shows FWHM and intensity of a peak in a poly-Si layer crystallized in accordance with annealing temperature.

FIG. 3 shows FWHM and intensity of a peak to the directions of <111> in a poly-Si layer crystallized in accordance with annealing temperature. Referring to FIG. 3, as the annealing temperature rises, peak intensity of <111> increases and FWHM of the <111> peak is likely to increase between 0.25~0.4°.

Relating to the above results, the crystallization characteristic of the poly-Si layer crystallized by Ni induced crystallization becomes better as the annealing temperature increases. When Ni induced crystallization is carried out by depositing Ni of about 0.4 nm on amorphous silicon of about 2000 Å and annealing the layers for about 5 hours, crystallization is achieved at the annealing temperature of 480° C. Thus, as the annealing temperature becomes high, so does the degree of crystallization to provide an excellent poly-Si layer.

(2) Characteristic of a Poly-Si Layer According to Ni Thickness.

A crystallization characteristic of silicon by varying Ni thickness is surveyed. FIGS. 4 to 13B explain the results of the test for crystallizing an amorphous silicon layer by varying average Ni thickness from 0.4 to 2.5 nm. Ni layers of 0.4, 0.7, 1.3 and 2.5 nm are deposited on an amorphus silicon layer of about 2000 Å. Thereafter, amorphous silicon is crystallized by annealing under $N_2$ ambience for about 5 hours at about 520° C.

Figure 4:
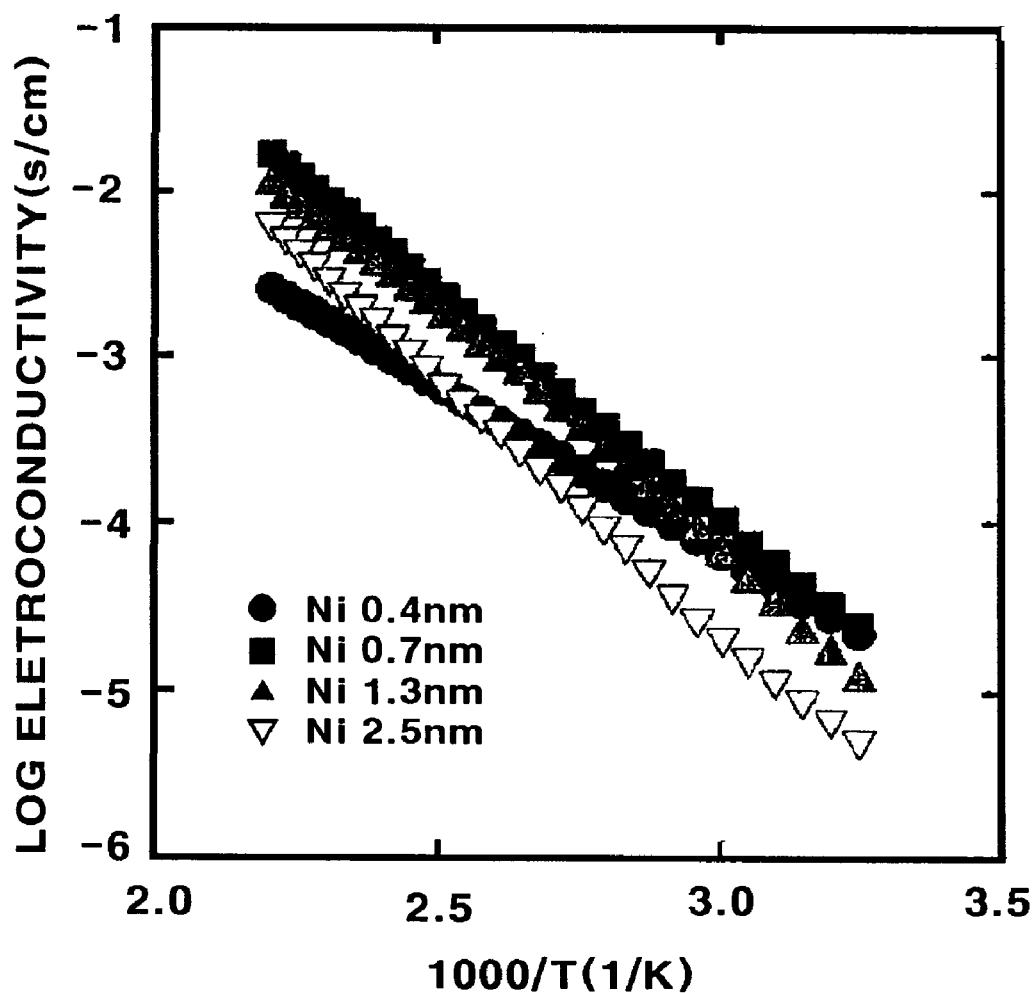
FIG. 4 shows electric conductivity of a poly-Si crystallized in accordance with the thickness of Ni.

FIG. 4 shows conductivity of poly-Si crystallized in accordance with the thickness of Ni. Referring to FIG. 4, each electrical conductivity of poly-Si layers shows much the same at room temperature, similar to that of a conventional poly-Si layer.

Figure 5:
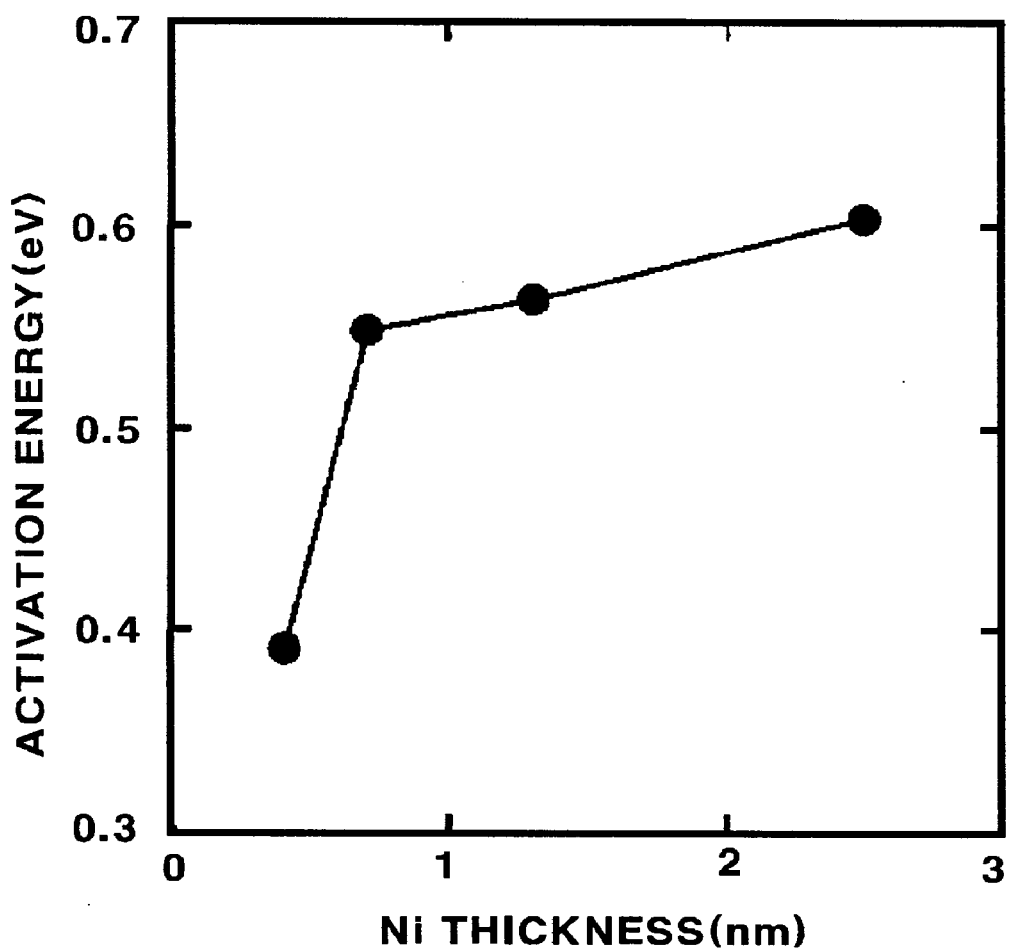
FIG. 5 shows relations between Ni thickness and activation energy of electric conductivity in a poly-Si crystallized in accordance with Ni thickness.

FIG. 5 shows relations between Ni thickness and activation energy of electric conductivity in poly-Si crystallized in accordance with Ni thickness. Referring to FIG. 5, under the same annealing condition, the activation energy of electric conductivity decreases about 0.60 to 0.39 eV as Ni thickness decreases. The difference, which is between conduction band edge energy Ec and Fermi level energy $E_f$, and potential barrier at a grain border add up to the activation energy. When the potential barrier is low, the activation energy becomes as good is the energy difference between Ec and $E_F$.

Figure 6:
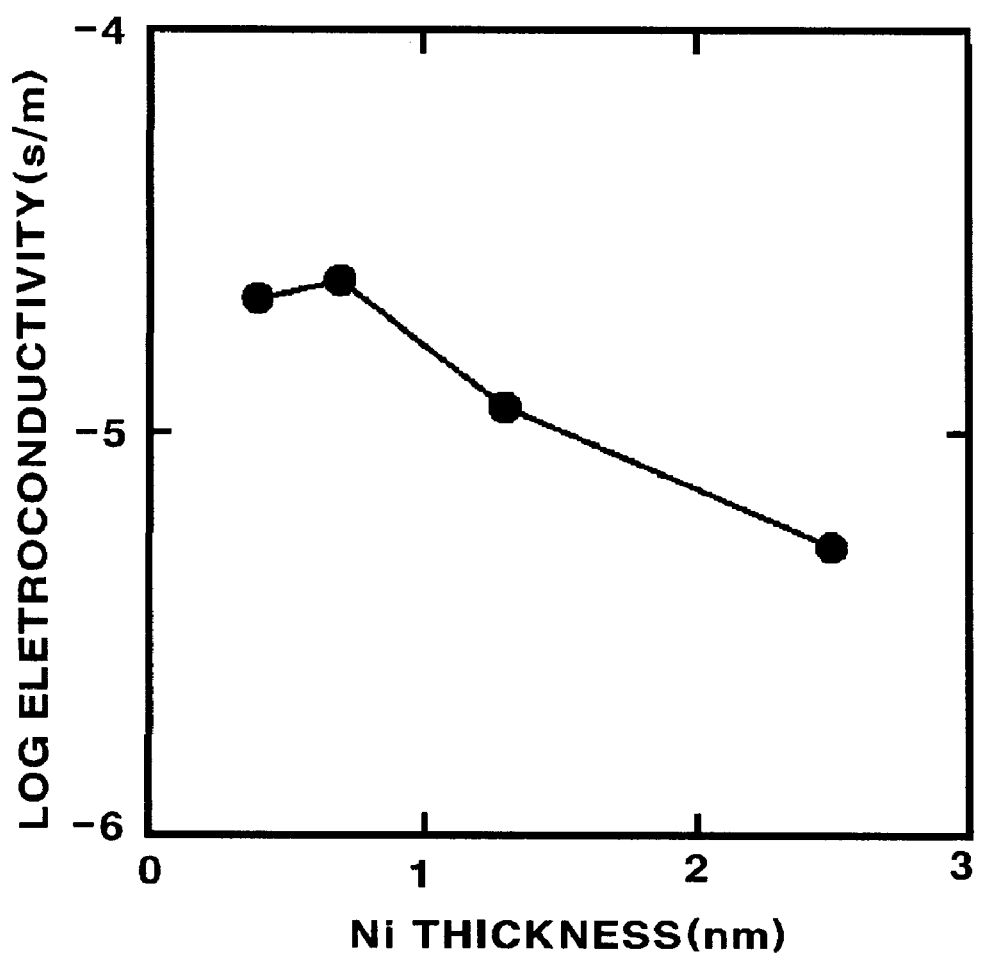
FIG. 6 shows relations between Ni thickness and logarithmic electric conductivity in a poly-Si crystallized in accordance with Ni thickness.

FIG. 6 shows relations between Ni thickness and logarithmic electric conductivity in poly-Si crystallized in accordance with Ni thickness. Referring to FIG. 6, as Ni thickness increases, dark conductivity drops from about $2.2 \times 10^{-5}$ to $5.1 \times 10^{-6}$ S/cm.

Figure 7:
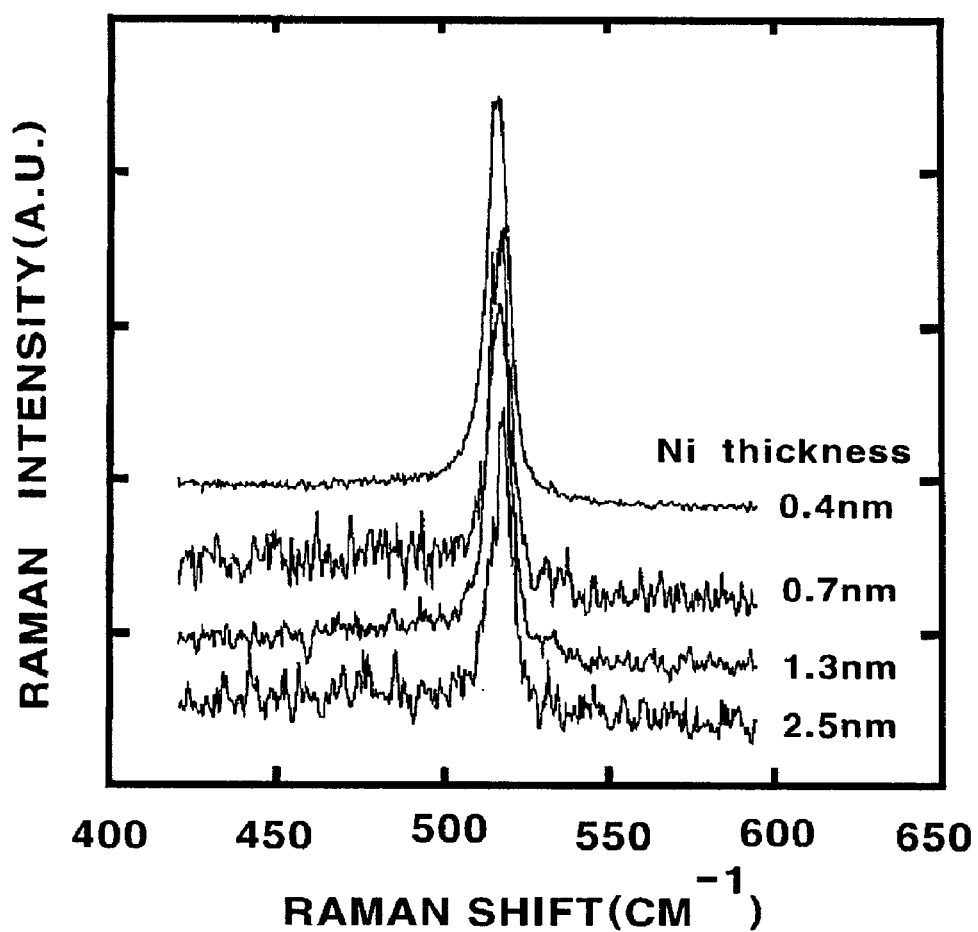
FIG. 7 shows Raman spectrum of a poly-Si layer crystallized in accordance with Ni thickness.

FIG. 7 shows Raman spectrum of a poly-Si layer crystallized in accordance with Ni thickness, wherein crystallization is carried out by depositing Ni layers and wherein each average thickness is 0.4. 0.7, 1.3 and 2.5 nm on amorphous silicon layers. Referring to FIG. 7, sharp peaks around 520 cm$^{-1}$ mean that crystallization of silicon is achieved. According to Ni thickness, positions of the Raman peaks are shifted little. The degree of crystallization is little affected by varying, Ni thickness of 0.4 to 2.5 nm when annealing is carried out for 5 hours at about 520° C. The degree of crystallization of a poly-Si layer is over 90%.

Figure 8:
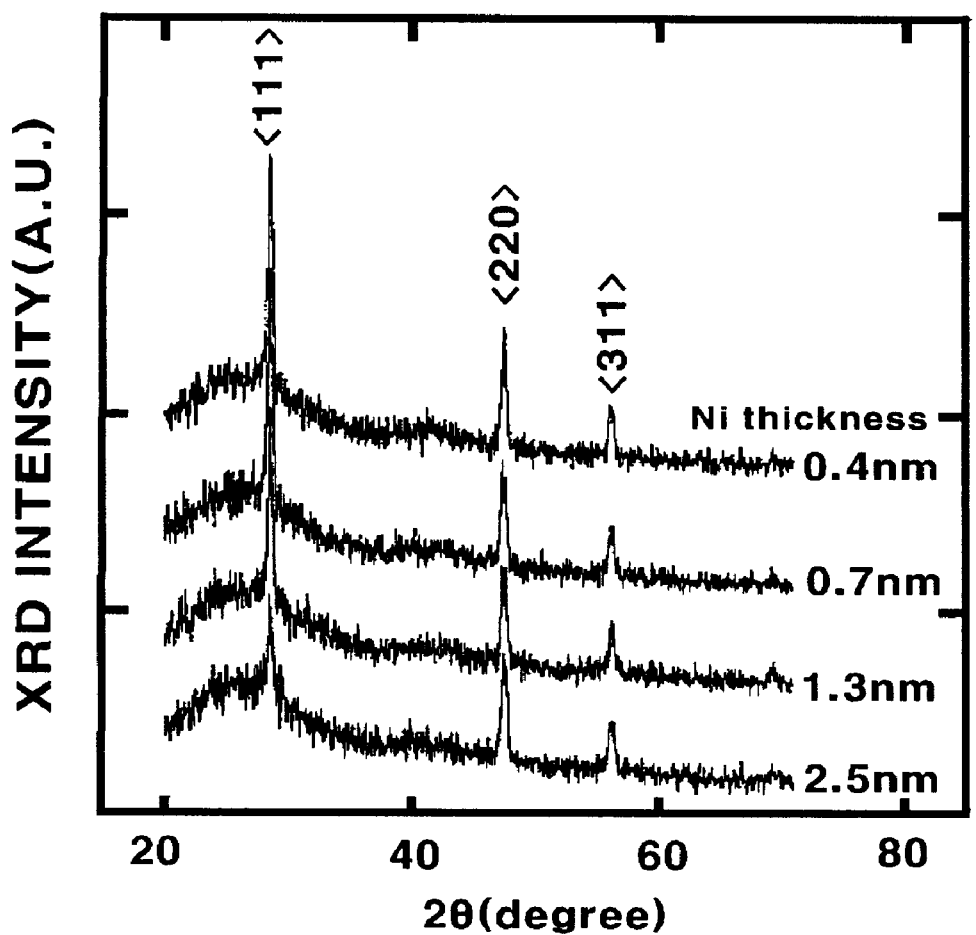
FIG. 8 shows XRD peaks of a poly-Si layer crystallized in accordance with Ni thickness.

FIG. 8 shows XRD peaks of a poly-Si layer crystallized in accordance with Ni thickness. Referring to FIG. 8, in case of Ni thickness of about 4 to 2.5 nm, peaks to the directions <111>, <220> and <311> are measured. As Ni thickness decreases, peaks, especially to the direction of <111>, increase. The peak increase to the direction of <111> is caused by the increasing crystal growth to the direction of <111> due to the reduced density of crystallizing nuclei in accordance with the decreasing Ni thickness.

Figure 9:
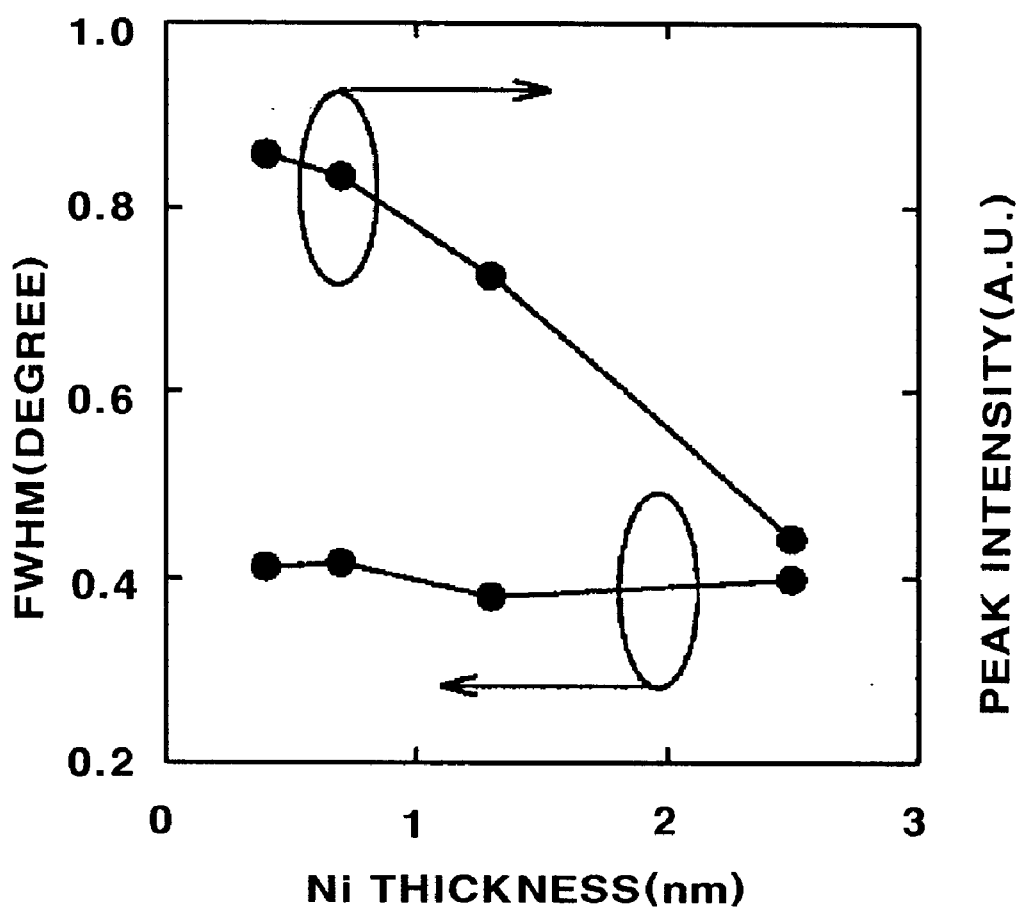
FIG. 9 shows FWHM and intensity of a peak to the directions of <111> in a poly-Si layer crystallized in accordance with Ni thickness.

FIG. 9 shows FWHM and intensity of a peak to the directions of <111> in a poly-Si layer crystallized in accordance with Ni thickness. Referring to FIG. 9, under the same annealing condition, the <111> peak intensity increases and FWHM of <111> peaks are much the same between 0.38~0.416° as Ni thickness decreases, namely, the crystal growth to the direction of <111> is inclined to increase as Ni thickness decreases.

Figure 10:
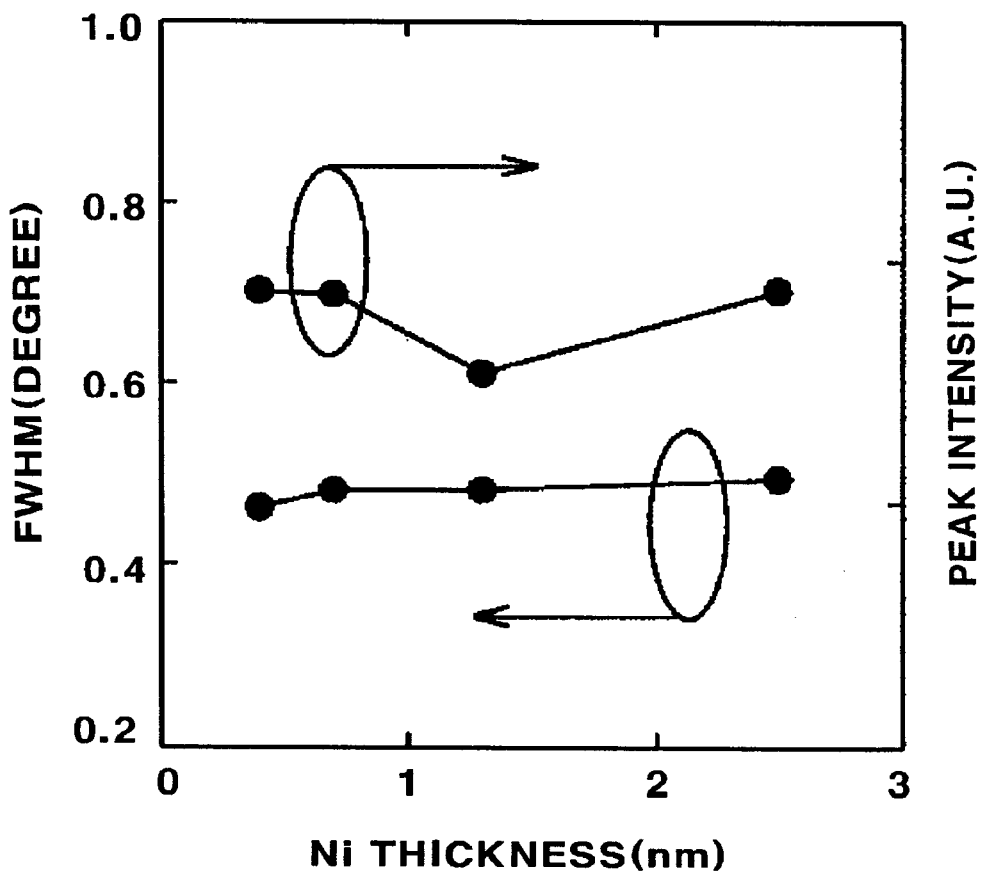
FIG. 10 shows FWHM and intensity of a peak to the directions of <220> in a poly-Si layer crystallized in accordance with Ni thickness.

FIG. 10 shows FWHM and intensity of a peak to the directions of <220> in a poly-Si layer crystallized in accordance with Ni thickness. Referring to FIG. 10, regardless of Ni thickness change, the intensity is constant and FWHM of the <220> peak are constant wherein FWHM is around 0.481~0.493°.

Figure 11:
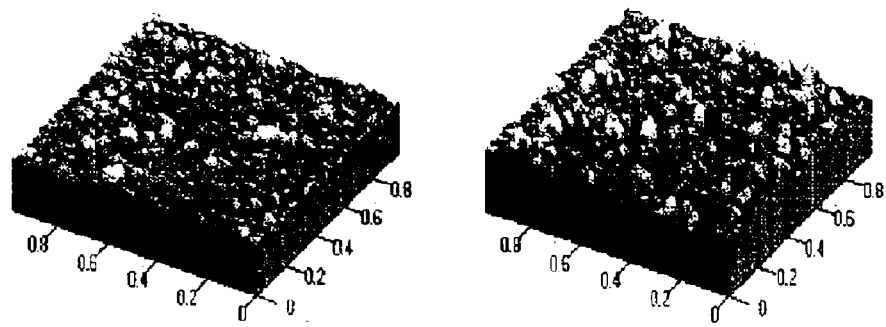
FIG. 11 shows an AFM picture of a poly-Si layer crystallized in accordance with Ni thickness.
Figure 11:
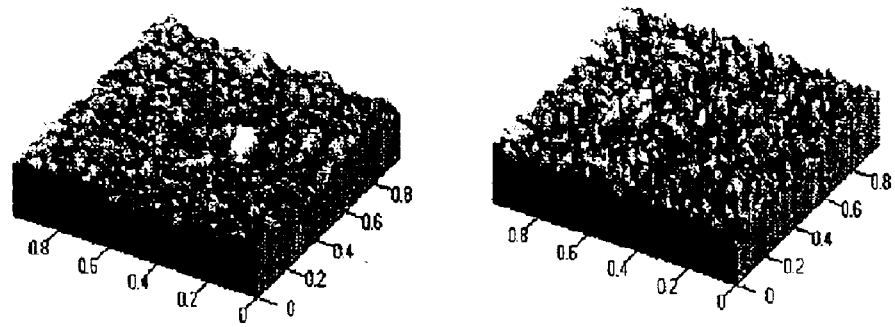

FIG. 11 shows an AFM picture of a poly-Si layer crystallized in accordance with Ni thickness. Referring to FIG. 11, width and length are all 1 μm. As Ni thickness increases, so does roughness of a surface. This is because the distances among the crystallizing nuclei become shorter, owing to the increasing Ni thickness. Thus the sizes of grains are decreased and the surface becomes rougher, due to the increased number of crystallizing nuclei. Under the same annealing condition, Ni thickness on amorphous silicon should be thin since the surface roughness of the layer affects TFT application very much.

Figure 12:
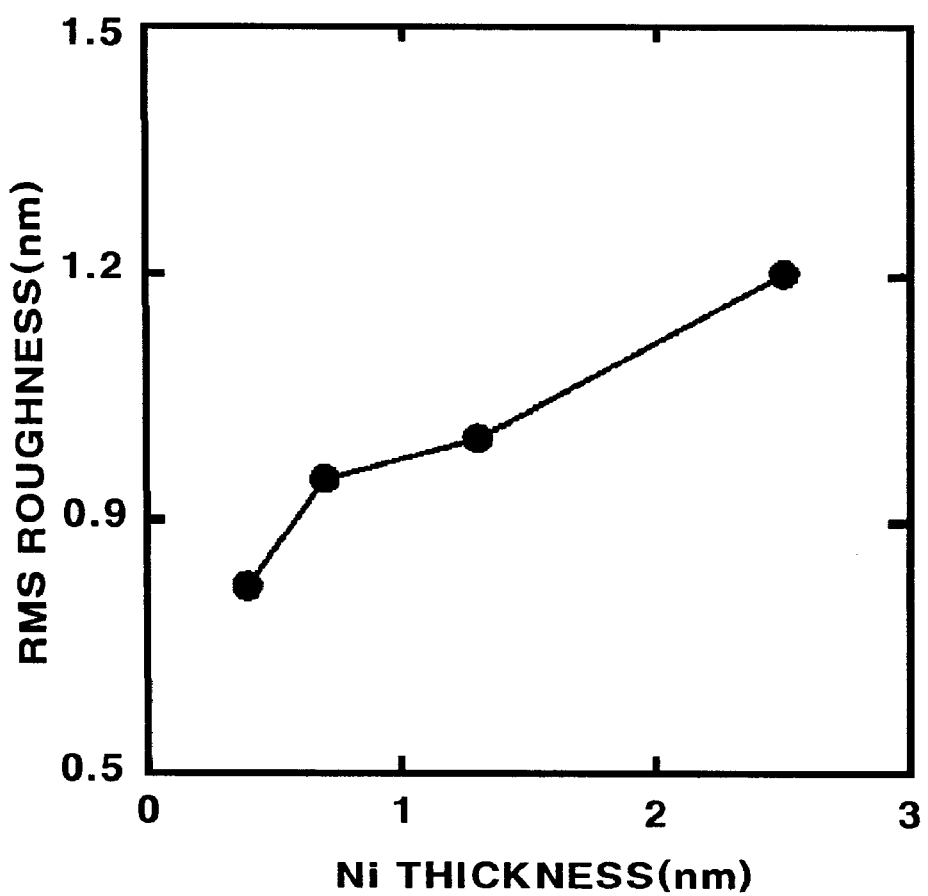
FIG. 12 shows relations between Ni thickness and RMS roughness attained by an AFM test in a poly-Si layer crystallized in accordance with Ni thickness.

FIG. 12 shows relations between Ni thickness and root mean square (RMS) roughness attained by an AFM test in a poly-Si layer crystallized in accordance with Ni thickness. Referring to FIG. 12, as Ni thickness increases, so does RMS roughness 8.2 to 12 Å. The surface condition of the poly-SI layer crystallized by Ni induced crystallization becomes more excellent as the used amount of Ni is less.

Figure 13A:
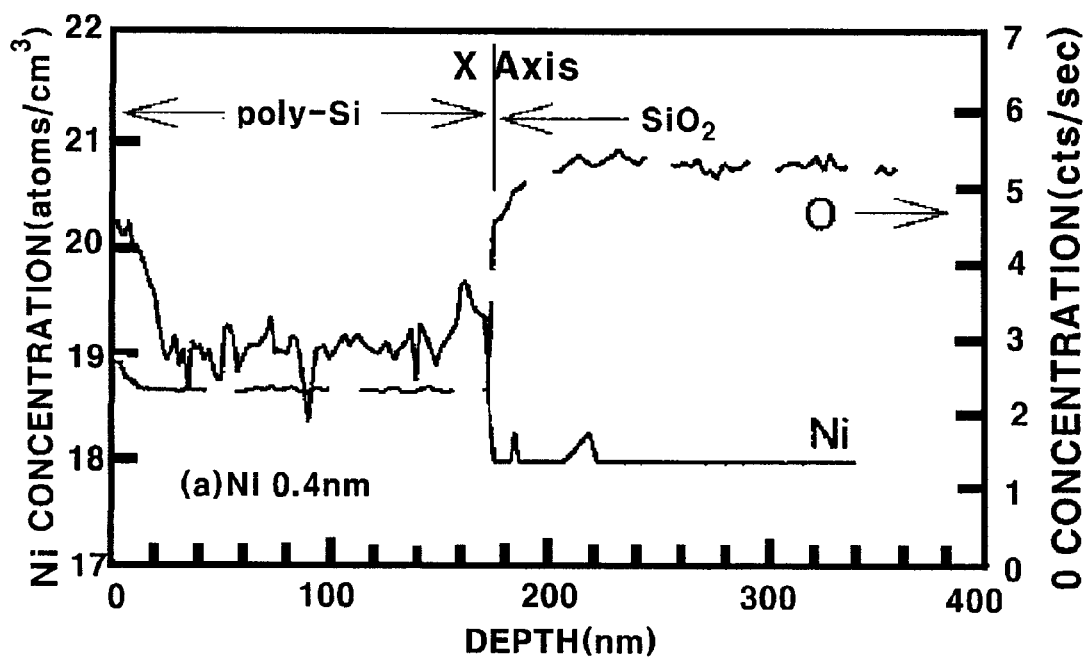
FIGS. 13A to 13C show a depth profile relating to Ni and O in a poly-Si layer crystallized in accordance with Ni thickness.
Figure 13B:
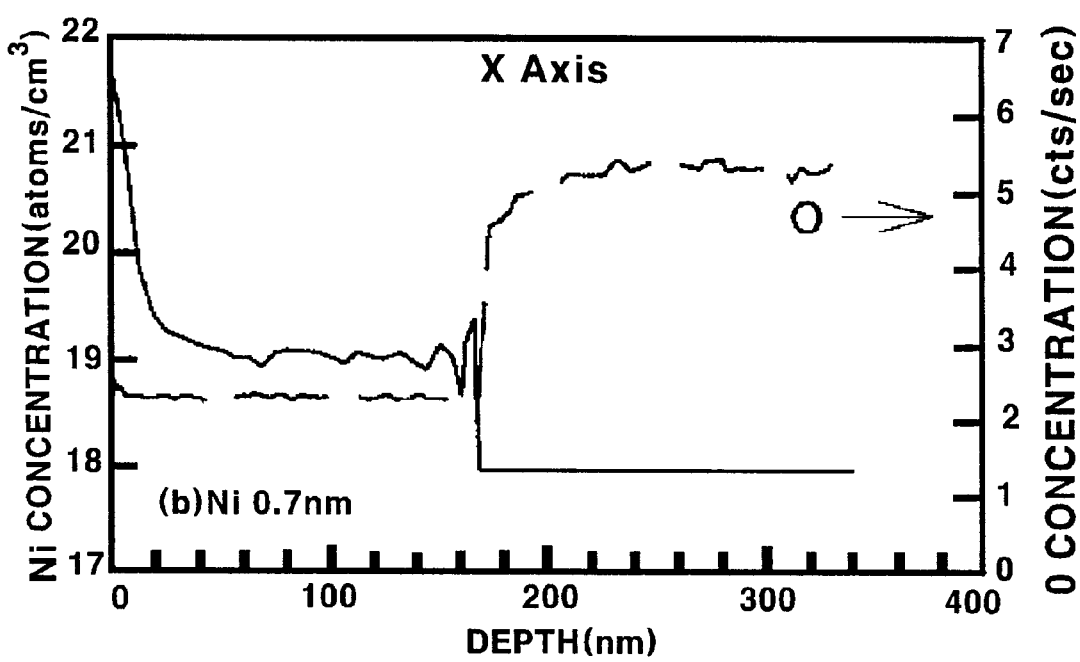
Figure 13C:
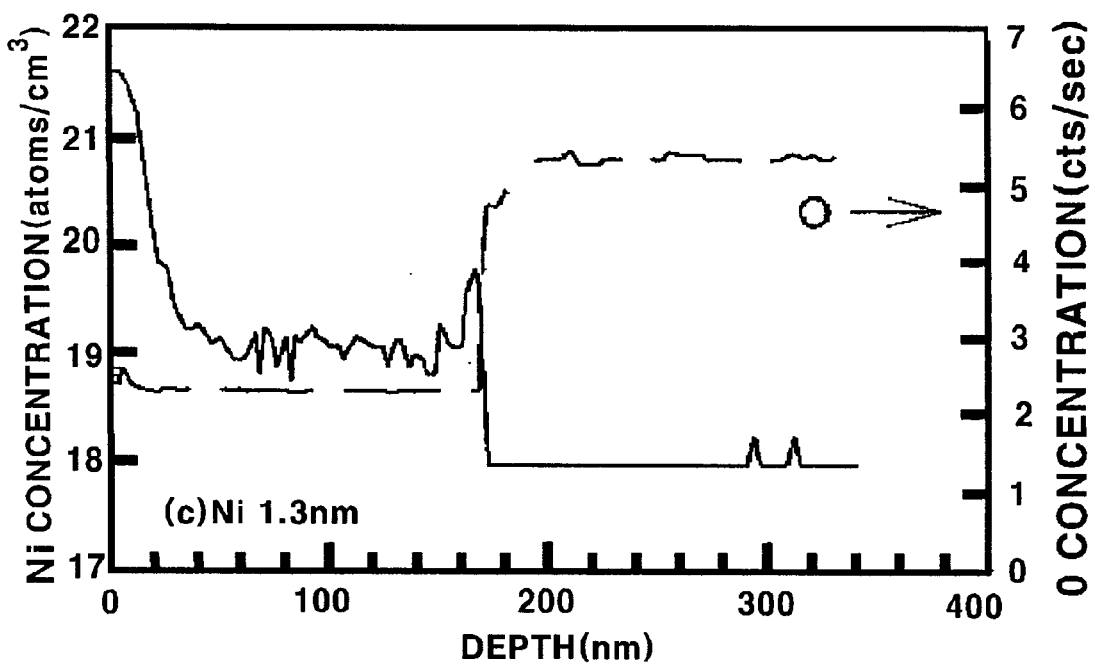

FIGS. 13A to 13C show a depth profile relating to Ni and O in a poly-Si layer crystallized in accordance with Ni thickness, wherein the profile is attained by SIMS (secondary ion mass spectroscopy) measurement.

Ni having thicknesses of about 0.4, 0.7 and 1.3 nm is used to crystalize an amorphous silicon layer by annealing for 10 hours at 500° C. As Ni thickness increases 0.4 to 1.3 nm, so does the amount of Ni at the surface from about $1.5 \times 10^{20}$ atoms/cm$^2$ to $4 \times 10^{21}$ atoms/cm$^2$. A small quantity of Ni peak at the interface between crystalline silicon and a glass substrate explains that the crystal growth by the NiSi$_2$ phase change from amorphous silicon to the substrate stops at the glass substrate.

(3) Characteristics of a Poly-Si Layer According to the Density of Ni Atoms.

In the following description, instead of forming Ni layer, Ni atoms are distributed on an amorphous silicon layer to the predetermined density. Then test results are attained by crystallizing the amorphous silicon layer.

FIGS. 14 to 16B show the results of the test for crystallizing an amorphous silicon layer after Ni atoms in density of about $2 \times 10^{11}$/cm$^2$ and $7 \times 10^{13}$/cm$^2$ have been deposited on the amorphous silicon layer. Amorphous silicon is crystallized by depositing Ni on amorphous silicon of 2000 Å and by annealing the layer under $N_2$ ambience for about 20 hours at 500° C. The Ni layer need not be evenly distributed on the entire surface so long as the above indicated density is achieved.

Figure 14:
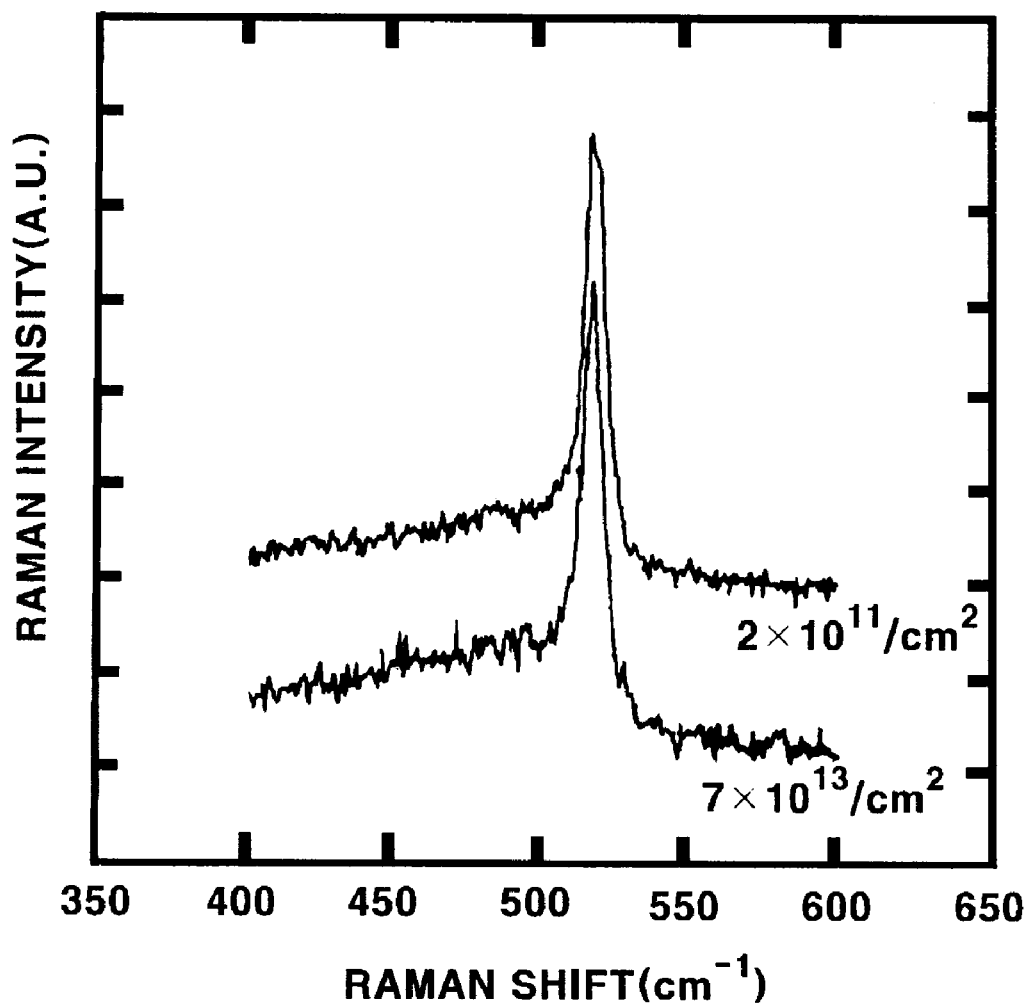
FIG. 14 shows Raman spectrum of a poly-Si layer crystallized in accordance with Ni density.

FIG. 14 shows Raman spectrum of a poly-Si layer crystallized in accordance with Ni density. Referring to FIG. 14, sharp peaks around 520 cm$^{-1}$ mean that crystallization of silicon is achieved. According to Ni thickness, positions of the Raman peaks are slightly shifted. The degree of crystallization is minutely affected by varying Ni density from about $2 \times 10^{11}$/cm$^2$ to $7 \times 10^{13}$/cm$^2$ when annealing is carried out for 5 hours at 520° C. In this case, the degree of crystallization of a poly-Si layer is over 90%.

Figure 15:
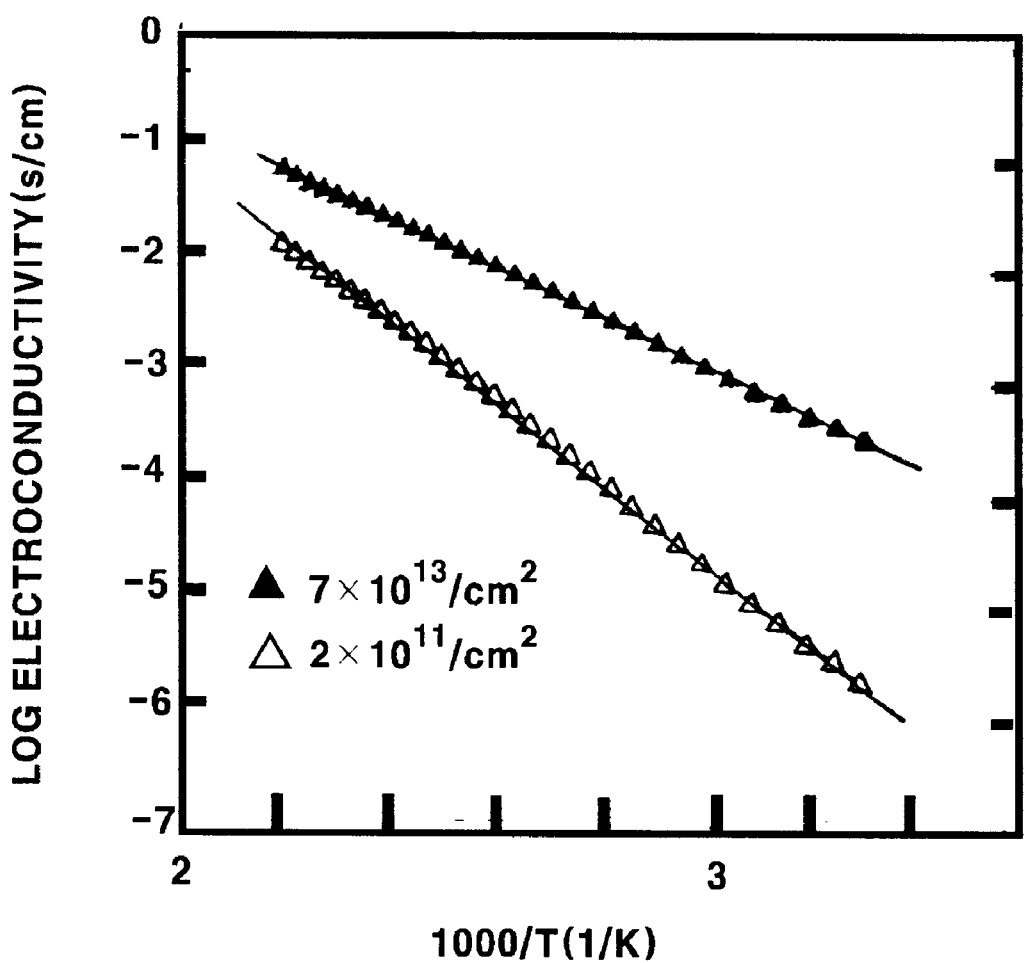
FIG. 15 shows electric conductivity of a poly-Si crystallized in accordance with Ni density.

FIG. 15 shows electric conductivity of a poly-Si crystallized in accordance with density of Ni atoms deposited on an amorphous silicon layer. Referring to FIG. 15, each electric conductivity of poly-Si layers shows much the same at room temperature and similar to that of an ordinary poly-Si layer.

Figure 16A:
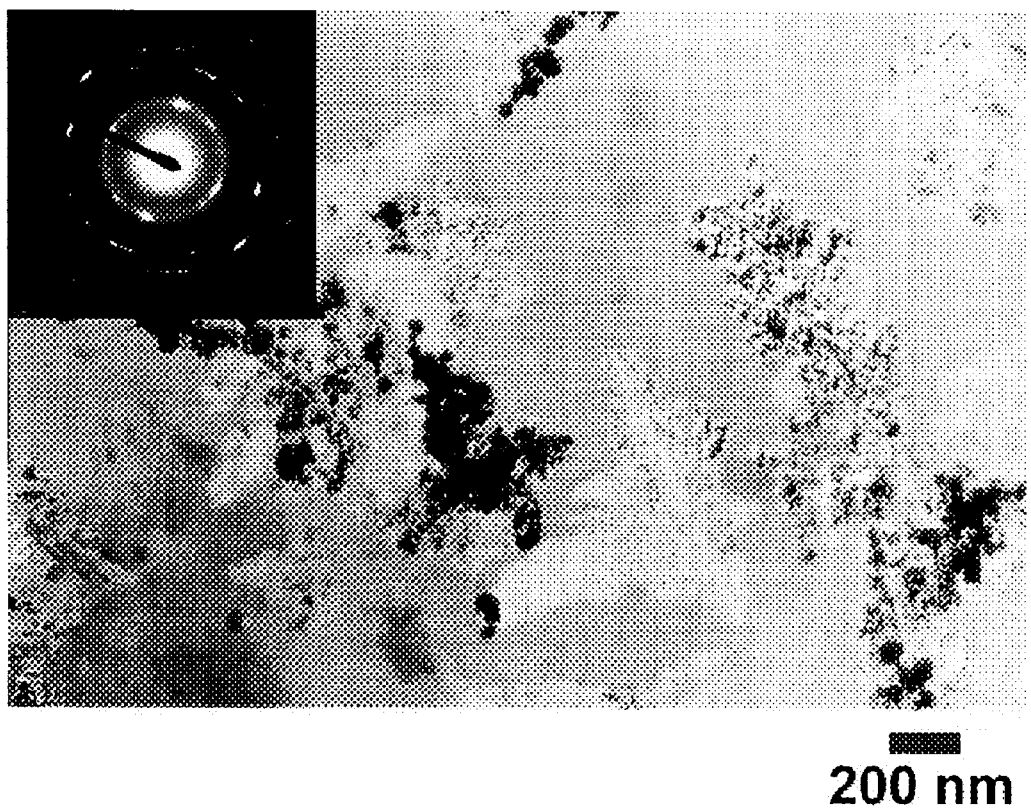
FIG. 16A shows TEM (Transmission Electron Microscopy) view of poly-Si layers crystallized by MIC with Ni deposition of $2 \times 10^{11}/cm^2$ average and its TED (Transmission Electron Diffraction)
Figure 16B:
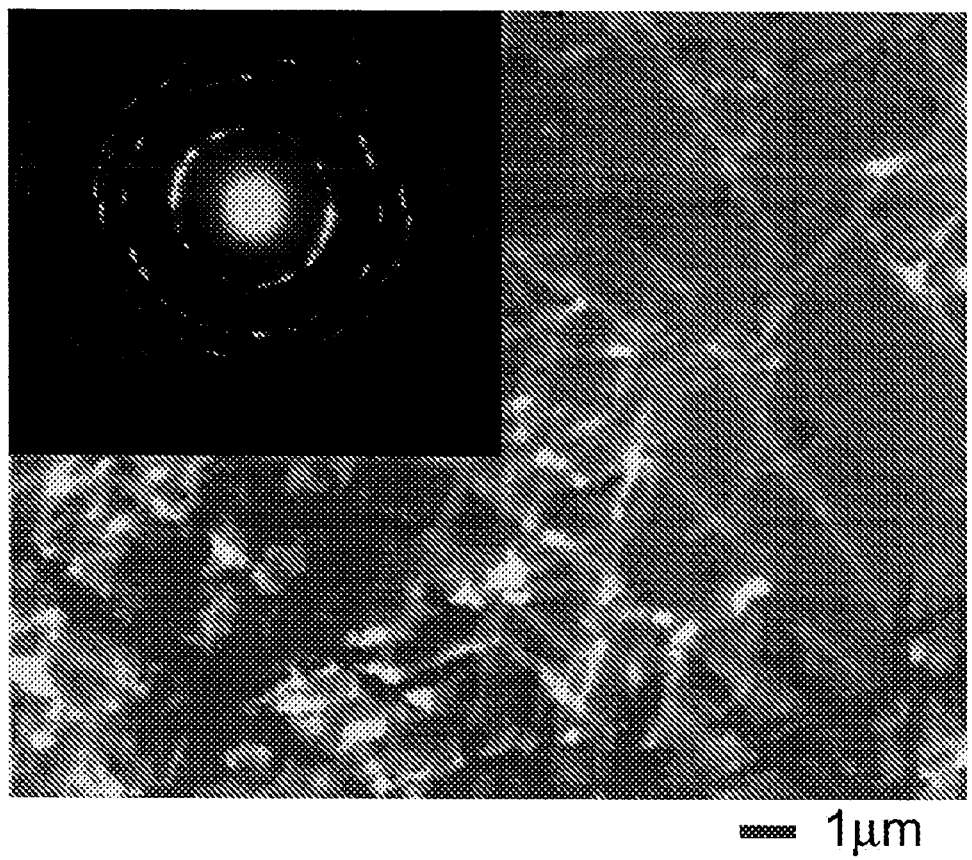
FIG. 16B shows TEM and TED views of poly-Si layers with Ni deposition of $7 \times 10^{13}/cm^2$ average.
Figure 16C:
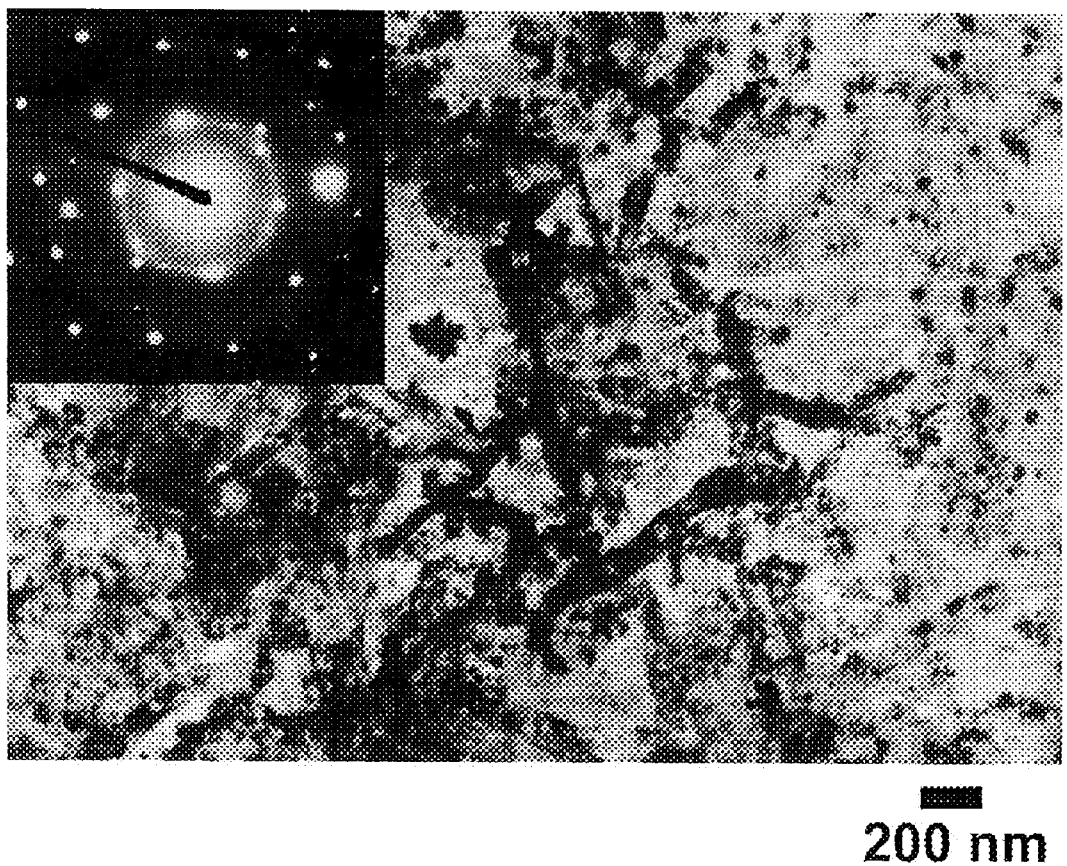
FIG. 16C shows TEM and TED views of poly-Si layers with Ni deposition of 0.3 angstroms average.

FIG. 16A shows TEM(Transmission Electron Microscopy) view of poly-Si layers crystallized by MIC with Ni deposition of $2 \times 10^{11}$/cm$^2$ and its TED (Transmission Electron Diffraction). FIG. 16B shows the TEM and TED for Ni deposition of to $7 \times 10^{13}/cm^2$. FIG. 16C shows the TEM and TED for Ni deposition of 0.3 Å average. Analyses of the TEM images and TED images of the three crystallized layers show that they have a good crystalline quality, respectively. Each crystallized silicon layers show that a plurality of crystalline grains of stick shapes constitute a network wherein width and length of each grain are about 150 nm to several microns.

Accordingly, considering the above test results by referring to FIGS. 14 and 15, an amorphous silicon layer is crystallized not only by depositing massively Ni, which is an induced substance for crystallizing amorphous silicon, but also by distributing Ni atoms on the amorphous silicon layer to the predetermined density.

(4) Comparing a Case of Coating an Amorphous Silicon Layer with a Ni Solution to the Other Case of Depositing Ni.

Figure 17A:
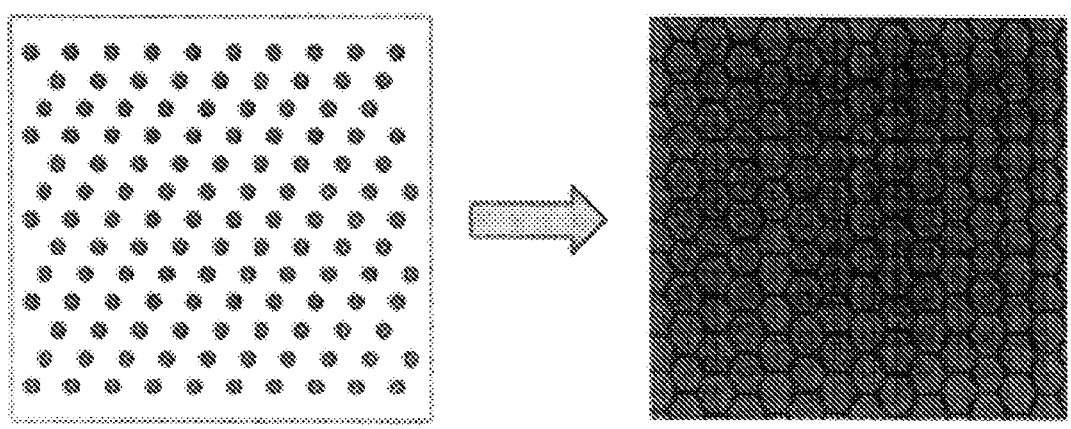
FIGS. 17A and 17B show TEM bright-field views of a poly-Si layer crystallized by MIC with Ni deposition and the other poly-Si layer crystallized in use of a Ni solution, respectively.
Figure 17A:
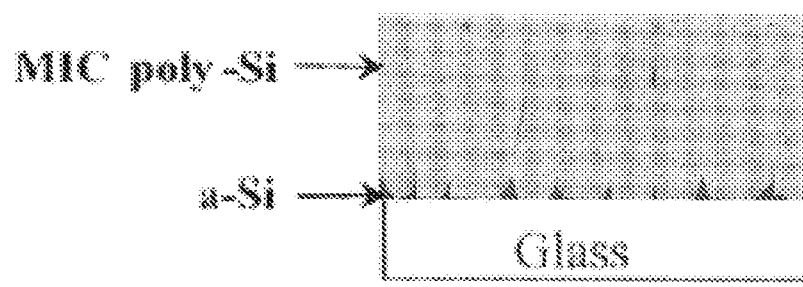
Figure 17B:
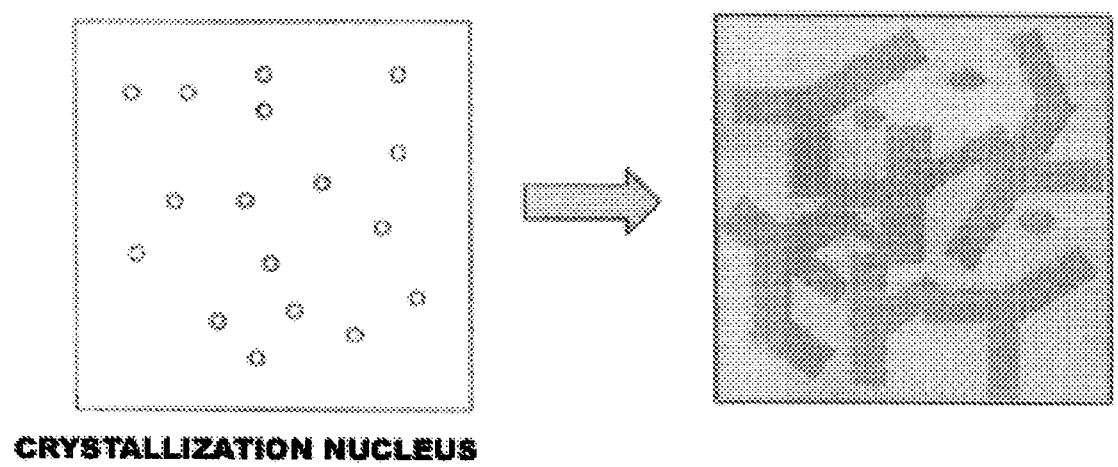

FIGS. 17A and 17B show TEM views of a poly-Si layer crystallized by MIC with Ni deposition and the other poly-Si layer crystallized in use of a Ni solution, respectively. Referring to FIG. 16A, when a poly-Si layer crystallized by depositing in vacuum or sputtering Ni of 2.5 nm is observed by TEM view, the silicon layer is full of grains of 50~100 nm. FIG. 16B illustrates a crystallization test wherein a silicon layer is coated with a Ni solution of 10,000 ppm and annealed for 20 hours at 500° C. A plurality of crystalline grains of stick shapes constitute a network wherein width and length of each grain are 150 nm and several microns.

FIG. 17A shows a picture of a sample wherein the crystallization process is completed, while FIG. 17B illustrates a picture of another sample wherein the crystallization process has not been completed, where crystalline parts of stick shapes show up and amorphous parts are shown.

Figure 18A:
FIGS. 18A and 18B show MIC models of two cases wherein Ni deposition (~10 Å) and a very thin Ni coating (~0.03 Å) are carried out, respectively.
Figure 18B:

FIGS. 18A and 18B show MIC models of two cases wherein Ni deposition (~10 Å) and a very thin Ni coating (~0.03 Å) are carried out, respectively.

The grain sizes and the shapes of crystals depend on the amount of Ni.

Referring to FIG. 18A, a model of crystallization is shown when the density of crystallizing nuclei is high, wherein MIC is carried out by depositing Ni. After crystallization, the sizes of grains depend on the distances from the crystallizing nuclei around. Referring to FIG. 18B, a model of crystallization is also shown when a Ni solution is used for When poly-Si is crystallized using a very thin Ni layer, the layer is crystallized by the growth of crystalline phase of a stick shape to the direction of <111>. Width and length of the crystalline phase are about 150~200 nm and several μm, respectively. The growth of crystalline silicon in amorphous silicon depends on an initial <111> face of $NiSi_2$.

However, the crystals in a layer grow to the direction of <111>. Namely crystals of stick shapes do not start to grow to the direction of <111> by the migration of $NiSi_2$ unless a vertical direction to the <111> face of $NiSi_2$ exists in a plane of the layer.

In the above test, the amorphous silicon layer is sufficiently crystallized by depositing Ni under 2.5 nm thereof. As Ni thickness decreases, so does density of $NiSi_2$ working as crystallizing nuclei. Then the density of crystallizing nuclei is reduced and the crystalline growth to the direction of <111> prevails. Thus, surface roughness of the layer becomes smooth by AFM measurement.

Crystallization of lateral migration by the migration of $NiSi_2$ occurs in a poly-Si layer crystallized using of a very thin Ni layer. The crystallization of an amorphous silicon layer is also achieved by depositing Ni atoms to a predetermined density, such as about $7 \times 10^{13}/cm^2$ to $2 \times 10^{11}/cm^2$ on the layer instead of using a Ni layer. The present invention reduces the surface roughness of the crystallized layer by crystallizing an amorphous silicon layer by MIC, wherein a metal layer, such as a Ni layer, is deposited on amorphous silicon.

During crystallization, the sizes of grains and the shapes of crystalline phase depend on Ni amount. Accordingly, in a crystallizing model of depositing Ni by MIC, the sizes of the grains after crystallization depend on the displacements of crystallizing nuclei. Moreover, in a crystallization processing using a very thin Ni layer, an amorphous silicon layer is crystallized by the growth of crystalline phases of stick shapes, wherein the crystalline shapes are formed by crystallizing nuclei of low density. Accordingly, as mentioned in the above description carried out by depositing Ni on an amorphous silicon layer, the crystallization of silicon is maximized by controlling the amount oil Ni.

Although suggesting a technique of crystallizing an amorphous silicon layer by depositing Ni, the present invention is also applied to the cases of using noble metals, such as Au, Ag, Al, Sb, In, and transition metals, such as Ti, Cu, etc., forming silicides with Si.

The present invention of crystallizing silicon is carried out by depositing an induced substance for crystallization to least thickness or density on an amorphous silicon layer by MIC. Thus crystallization of silicon is maximized and surface roughness of crystallized silicon is reduced.

Moreover, comparing to a related art, the speed of crystallizing silicon is increased and metal contamination by MIC is reduced. Accordingly, the characteristics of TFT using crystallized poly-Si are shown.

It will be apparent to those skilled in the art that various modifications and variations can be made in a method of crystallizing an amorphous silicon layer of the present invention without departing from the spirit or scope of the inventions. Thus, it is intended that the present invention cover the modifications and variations of this invention, provided they come within the scope of the appended claims and equivalents.

What is claimed is:

1. A method of crystallizing an amorphous silicon layer, comprising:

depositing a crystallizing-inducing layer of a substance for crystallizing silicon on the amorphous silicon layer wherein the crystallizing-inducing layer is formed to an average thickness of about 0.03 angstroms or less; and thermally treating the amorphous silicon layer on which the crystallizing-inducing layer is deposited.

2. The method of crystallizing an amorphous silicon layer according to claim 1, wherein the crystallizing-inducing layer is formed with at least one of noble metals and transition metals to form silicide with Si.

3. The method of crystallizing an amorphous silicon layer according to claim 2, wherein the noble metals include one of Au, Ag, Al, Sb and In.

4. The method of crystallizing an amorphous silicon layer according to claim 2, wherein the transition metals include one of Ti, Ni and Cu.

5. The method of crystallizing an amorphous silicon layer according to claim 1, wherein the crystallizing-inducing layer is formed by sputtering or vacuum deposition.

6. The method of crystallizing an amorphous silicon layer according to claim 1, wherein the crystallizing-inducing layer comprises Ni with the density of about $2 \times 10^{11}/cm^2$ to $7 \times 10^{13}/cm^2$.

7. The method of crystallizing an amorphous silicon layer according to claim 6 wherein the amorphous silicon layer is thermally treated for about 20 hours at about 500° C.

8. The method of crystallizing an amorphous silicon layer according to claim 1, wherein the thickness of the crystallizing-inducing layer is about 0.01 to 0.03 angstroms.

9. The method of crystallizing an amorphous silicon layer according to claim 8, wherein the crystallizing-inducing layer is formed with at least one of noble metals and transition metals to form silicide with Si.

10. The method of crystallizing an amorphous silicon layer according to claim 9, wherein the noble metals include one of Au, Ag, Al, Sb and In.

11. The method of crystallizing an amorphous silicon layer according to claim 9, wherein the transition metals include one of Ti, Ni and Cu.

12. The method of crystallizing an amorphous silicon layer according to claim 8, wherein the crystallizing-inducing layer comprises Ni with the density of about $2 \times 10^{11}/cm^2$ to $7 \times 10^{13}/cm^2$.

13. A method of crystallizing an amorphous silicon layer, comprising:
forming a crystallizing-inducing substance on the amorphous silicon layer, wherein the crystallizing-inducing substance has a density of about $7 \times 10^{13}/cm^2$ or less on a unit area of the amorphous silicon layer; and
treating thermally the amorphous silicon layer on which the crystallizing-inducing substance is formed.

14. The method of crystallizing an amorphous silicon layer according to claim 13, wherein the crystallizing-inducing substance formed on the amorphous silicon layer is distributed to have a thickness of about 0.03 angstroms or less.

15. The method of crystallizing an amorphous silicon layer according to claim 14, wherein the crystallizing-inducing substance formed on the amorphous silicon layer is distributed to have an average thickness of about 0.01 to 0.03 angstroms.

16. The method of crystallizing an amorphous silicon layer according to claim 15, wherein the amorphous silicon layer is thermally treated for about 20 hours at about 500° C.

17. The method of crystallizing an amorphous silicon layer according to claim 15, wherein an annealing time for transforming at least a part of the amorphous silicon layer into a polycrystalline silicon layer is proportional to the thickness of the amorphous silicon layer.

18. The method of crystallizing an amorphous silicon layer according to claim 14, wherein the crystallizing-inducing substance is formed by at least one of sputtering and vacuum depositions.

19. The method of crystallizing an amorphous silicon layer according to claim 13, wherein the crystallizing-inducing substance is formed by at least one of sputtering and vacuum depositions.

20. The method of crystallizing an amorphous silicon layer according to claim 13, wherein the density of the crystallizing-inducing substance is between about $2 \times 10^{11}/cm^2$ to $7 \times 10^{13}/cm^2$.

21. The method of crystallizing an amorphous silicon layer according to claim 13, wherein the crystallizing-inducing substance is introduced on the amorphous silicon layer by the sputtering deposition using an RF power of about 10W or less.

* * * * *